United States Patent
Hatab

(10) Patent No.: US 6,545,369 B1
(45) Date of Patent: Apr. 8, 2003

(54) OVERLAY ERROR REDUCTION BY MINIMIZATION OF UNPATTERNED WAFER AREA

(75) Inventor: Ziad R. Hatab, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 331 days.

(21) Appl. No.: 09/587,297

(22) Filed: Jun. 5, 2000

(51) Int. Cl.⁷ ............................................. H01L 23/544
(52) U.S. Cl. ...................................................... 257/797
(58) Field of Search ................................ 438/460, 462, 438/400, 401, 495; 29/25.01; 257/618, 622, 797

(56) References Cited

U.S. PATENT DOCUMENTS

| | | | |
|---|---|---|---|
| 4,779,004 A | 10/1988 | Tew et al. ................... | 250/518 |
| 5,710,407 A | 1/1998 | Moore et al. ................ | 219/405 |
| 5,733,711 A | 3/1998 | Juengling ................... | 430/312 |
| 5,852,497 A | 12/1998 | Pramanik et al. ........... | 356/401 |
| 5,923,996 A * | 7/1999 | Shih et al. ................... | 438/462 |
| 5,982,044 A * | 11/1999 | Lin et al. ..................... | 257/797 |
| 6,037,671 A * | 3/2000 | Kepler et al. ................ | 257/797 |
| 6,417,076 B1 * | 7/2002 | Holscher et al. ............ | 438/462 |

OTHER PUBLICATIONS

Jeffrey P. Hebb and Klavs F. Jensen, *The Effect of Patterns on Thermal Sress During Rapid Thermal Processing of Silicon Wafer*, IEEE Transaction on Semiconductor Manufacturing, vol. II, No. 1, Feb. 1998.

* cited by examiner

Primary Examiner—David L. Talbott
Assistant Examiner—Alonzo Chambliss

(57) ABSTRACT

A semiconductor wafer with reduced misalignment errors at its periphery and a method for producing such a semiconductor wafer are described. The wafer includes one or more global alignment sites, having global alignment marks, on its periphery. Some patterning is located on the global alignment sites, but not covering the global alignment marks. The patterning covering the global alignment sites reduces the amount of non-correctable misalignment errors experienced by the wafer. A buffer zone is provided around the global alignment marks to inhibit patterning over the marks.

9 Claims, 5 Drawing Sheets

OVERLAY ERROR REDUCTION BY MINIMIZATION OF UNPATTERNED WAFER AREA

FIELD OF THE INVENTION

The present invention generally relates to semiconductor wafer fabrication, and more particularly to a semiconductor wafer having a decreased degree of misalignment errors and a method for decreasing the degree of misalignment errors.

BACKGROUND

For more than a decade, rapid thermal process (RTP) reactors have been utilized in the processing of semiconductor wafers. RTP reactors have a process cycle which takes considerably less time than conventional reactors. For example, while conventional reactors may require forty to ninety minutes to perform a particular processing function on wafers, RTP reactors need only two to fifteen minutes to accomplish the same processing function.

A problem associated with RTP reactors is that high temperature gradients are created across the wafers-in-process, leading to thermal stress which leads to plastic deformation of the wafers-in-process, particularly in unpatterned and unprocessed areas at the edges of the wafers-in-process. Plastic deformation in turn may cause photolithography pattern misregistration because alignment marks for lithographic pattern registration are typically provided at the edges of wafers. If these alignment marks are distorted, due to wafer distortion, misalignment of the photolithograph step from one wafer layer to another may occur, causing device failure as device features are misaligned from one wafer layer relative to another.

For example, a stepper mechanism prints patterns on a photoresist layer of a wafer-in-process in sequence, moving a predetermined distance from one area of the wafer-in-process to another for each printing operation. The stepper continues this process until an entire layer of die patternings have been printed across the surface of the substrate. The stepper uses global alignment marks, also called combis, to ascertain its position above the wafer-in-process to determine where each die pattern is to be printed on a layer of photoresist. If the wafer-in-process has distortions in the combi sites, the unpatterned and unfabricated areas containing the combis which are typically at the unpatterned wafer periphery, the printing of the photoresist may be misaligned from where actual printing should occur. Thus, since the global alignment marks have moved due to wafer distortion, the stepper may print the next layer of photoresist misaligned relative to the previous layer, creating fabrication misregistrations between the layers.

Wafer distortions occurring at the periphery of wafers-in-process where the alignment marks are located are difficult to correct using conventional methods due to the random nature of such distortions. Specifically, with reference to FIGS. 1–4, the misalignments found at the periphery of a wafer due to distortion often do not conform, either in magnitude or phase, to the misalignments which may occur at the wafer's center. FIG. 1 illustrates raw grid data from the wafer's center, while FIG. 2 shows non-correctable grid data from the wafer's center. FIGS. 3 and 4 respectively illustrate the raw and non-correctable grid data from the wafer's periphery. It should be noted that while the misalignments in the wafer's center can be virtually completely corrected in the stepper device, a majority of the misalignments were retained along the wafer's periphery where the alignment marks are located. The retained misalignments as they relate to the global alignment marks will lead to a misregistration with the next patterning layer when the stepper uses the alignment marks for pattern printing.

Referring to FIG. 5, a patterned wafer 10 is shown with patterned portions 14 and non-patterned portions 13. Some of the nonpatterned portions 13 serve as global alignment mark sites, also called combi sites, 12. As illustrated, four combi sites 12 are positioned about the periphery of the wafer 10, each separated from adjacent sites 12 by generally ninety degrees and offset from x- and y-axes. FIG. 6 shows a patterned wafer 20 having patterned portions 24 and non-patterned portions 23. As with wafer 10, some of the non-patterned portions 23 serve as combi sites 22. The four illustrated combi sites 22 are located on the x- or y-axes. Both wafers 10 and 20 show conventional patterning and locations of combi sites 12, 22 on the periphery of the wafers. Each of the wafers 10, 20 experience thermal stress-induced misalignments at the unpatterned combi sites which may make it difficult for a lithographic patterning device, such as a stepper, to correctly pattern a photoresist layer.

Accordingly, a technique is needed to lessen peripheral distortions at combi sites due to thermally-induced stresses to thereby diminish registration errors in semiconductor fabrication processes.

SUMMARY

The present invention provides a semiconductor wafer that includes a substrate, one or more mask patterns located on the substrate, and one or more global alignment sites, each of the sites including an mask pattern partially overlying the site and not overlying a global alignment mark.

The present invention also provides a method for diminishing misalignments on a periphery of semiconductor wafers. The method includes the steps of determining the locations of global alignment marks on a wafer, determining the optimal size of partial fields to minimize nonpatterned areas adjacent to the global alignment marks, printing the partial fields at each masking layer during exposure of a photoresist material, and developing the photoresist material and processing the wafer at each mask layer.

The foregoing and other advantages and features of the invention will be more readily understood from the following detailed description of preferred embodiments, which is provided in connection with the accompanying drawings.

DETAILED DESCRIPTION OF THE PREFERRED EMBODIMENTS

The invention, exemplary embodiments of which are described herein with reference to the figures, relates to printing patterning and fabricating portions of a die structure near global alignment marks to reduce the amount of unpatterned and unfabricated area around the marks and thereby reduce the effects of thermally-induced stress on the wafer in the peripheral areas of the wafer, including around the global alignment marks.

Figure 1:
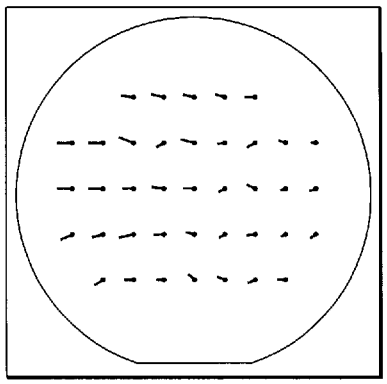
FIG. 1 is a representation of grid misalignments in the center of a conventionally fabricated wafer.
Figure 2:
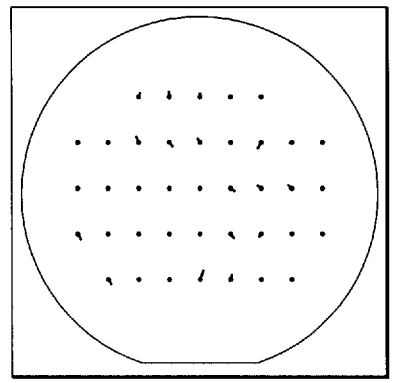
FIG. 2 is a representation of the wafer of FIG. 1 after correction of the grid misalignments with a stepper device.
Figure 3:
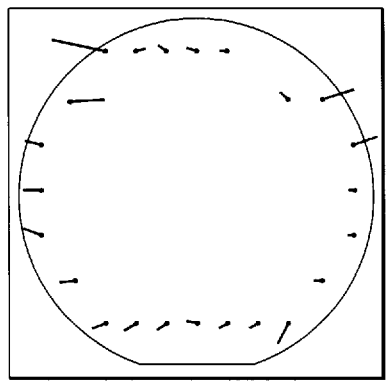
FIG. 3 is representation of grid misalignments on the edge of a conventionally fabricated wafer.
Figure 4:
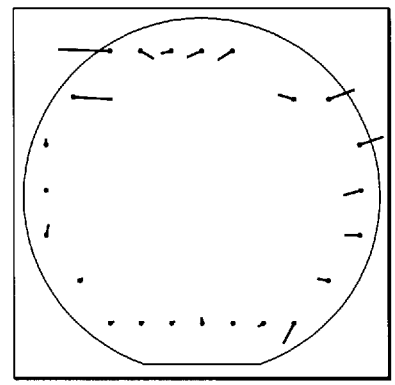
FIG. 4 is a representation of the wafer of FIG. 3 after correction of the grid misalignments with a stepper device.
Figure 6:
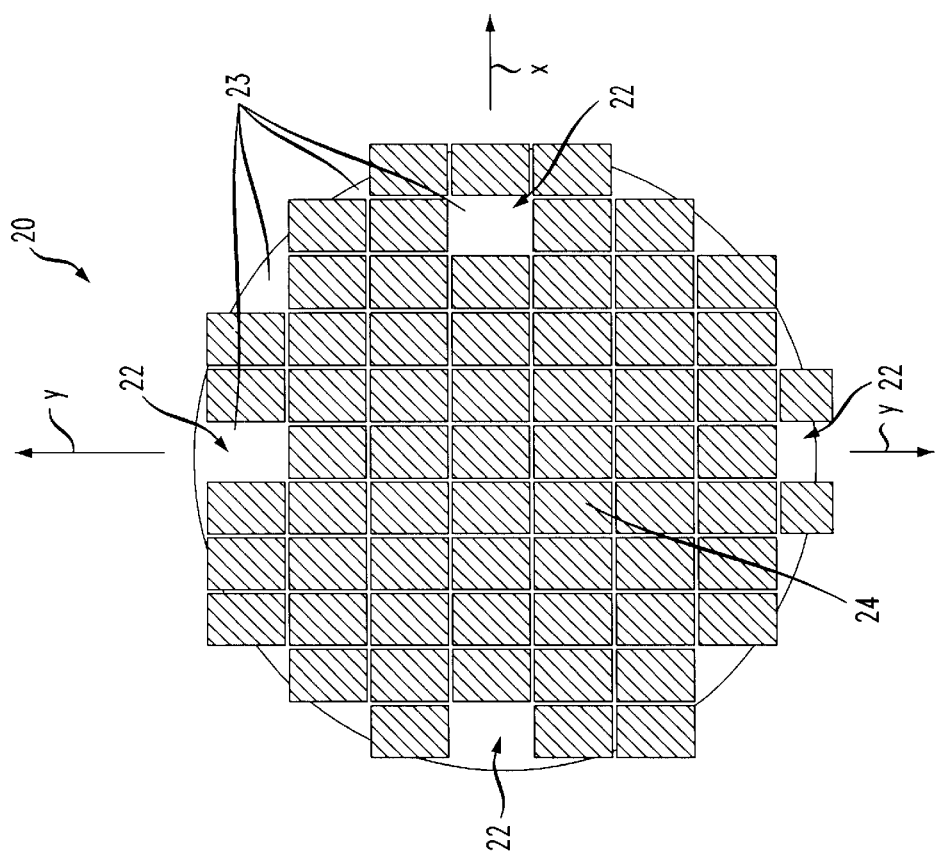
FIG. 6 is a representation of a patterned wafer with global positioning marks placed on Cartesian coordinate axes.
Figure 5:
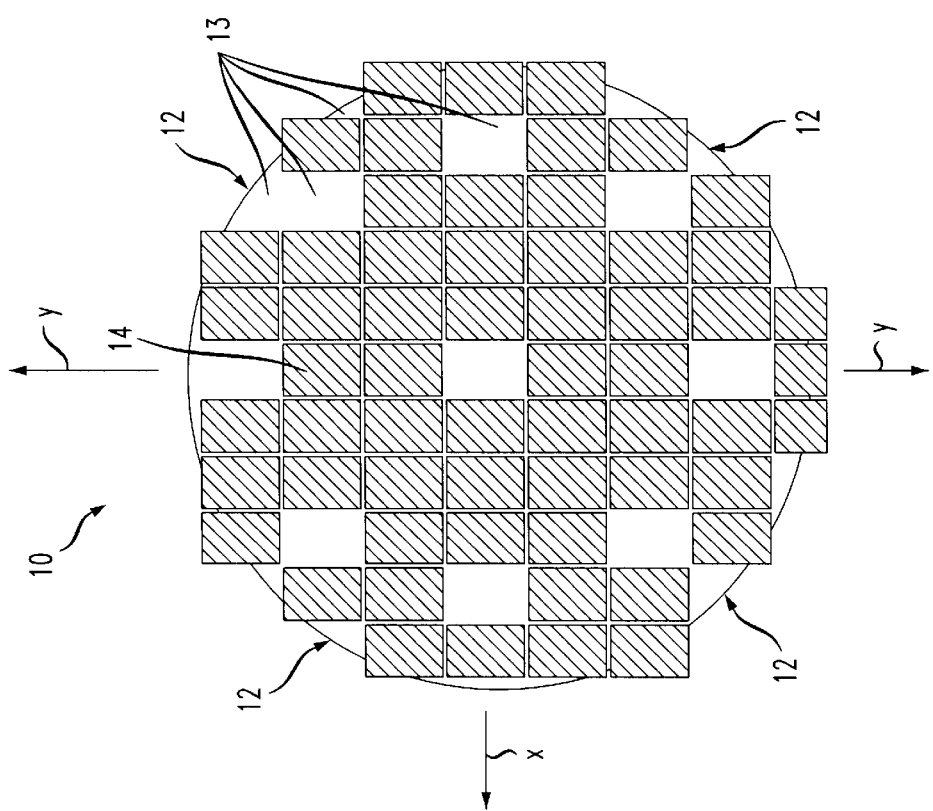
FIG. 5 is representation of a patterned wafer with conventionally placed global positioning marks.
Figure 7:
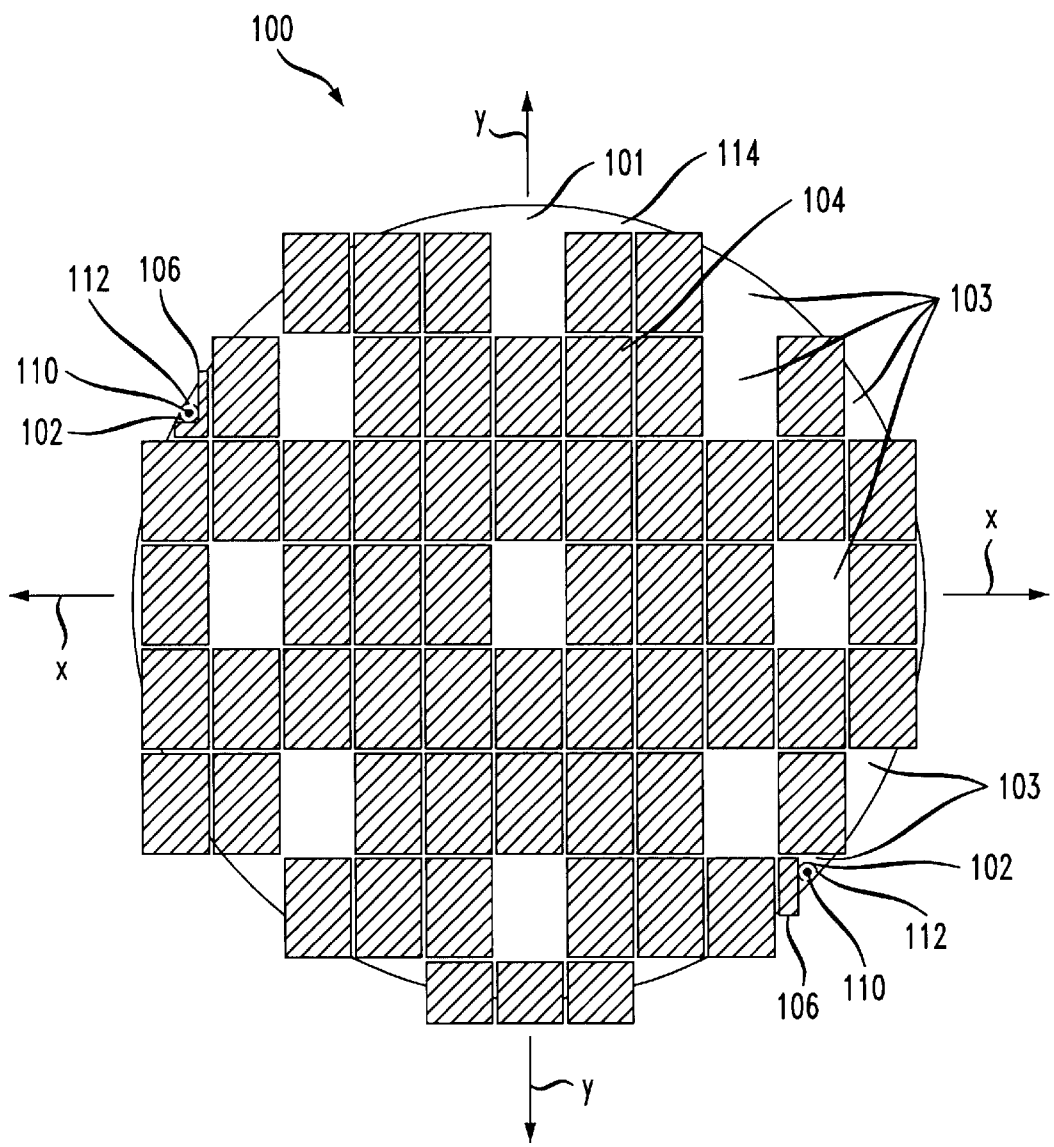
FIG. 7 is a representation of a patterned wafer constructed in accordance with another embodiment of the present invention.
Figure 8:
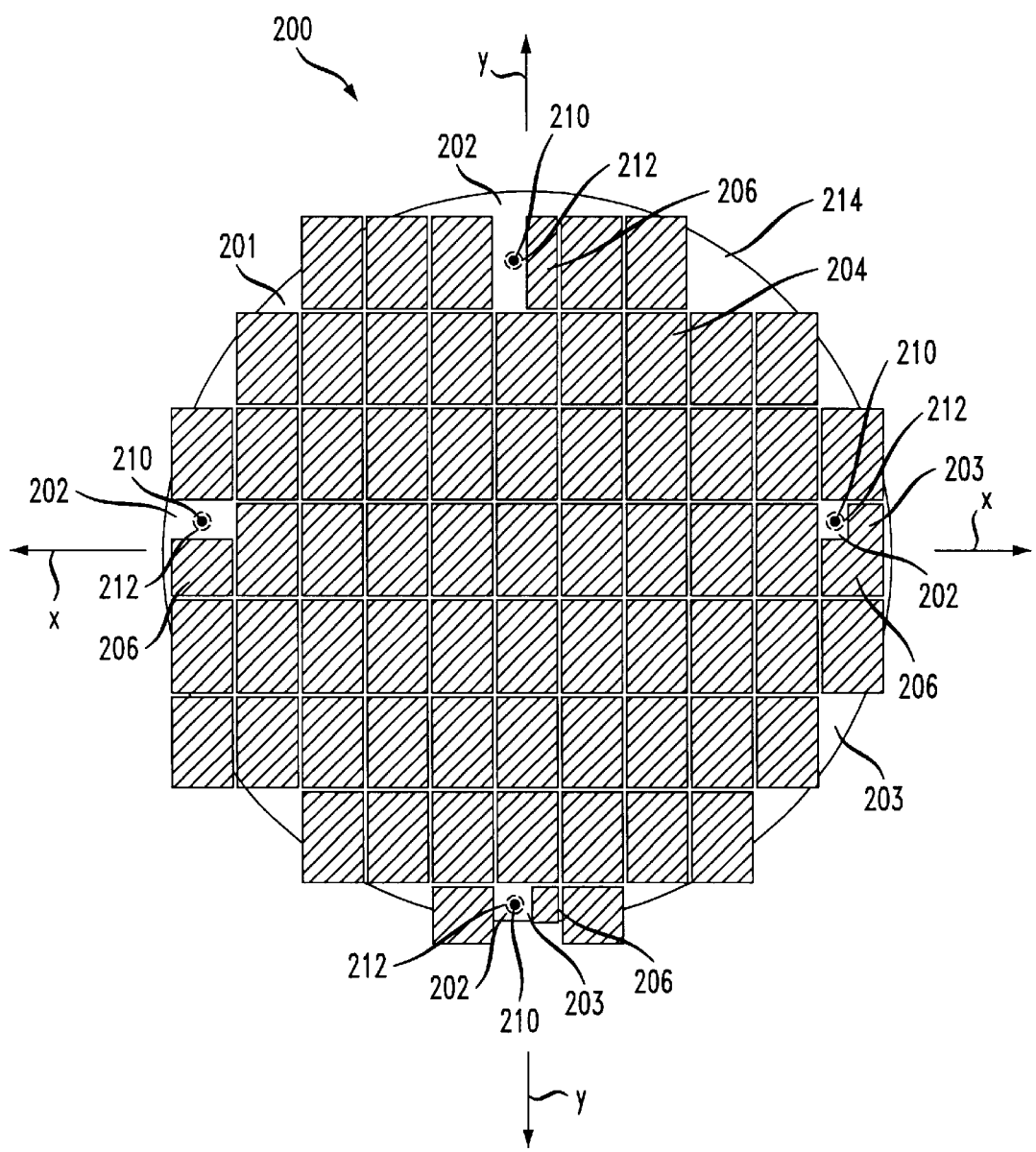
FIG. 8 is representation of a patterned wafer constructed in accordance with an embodiment of the present invention.
Figure 9:
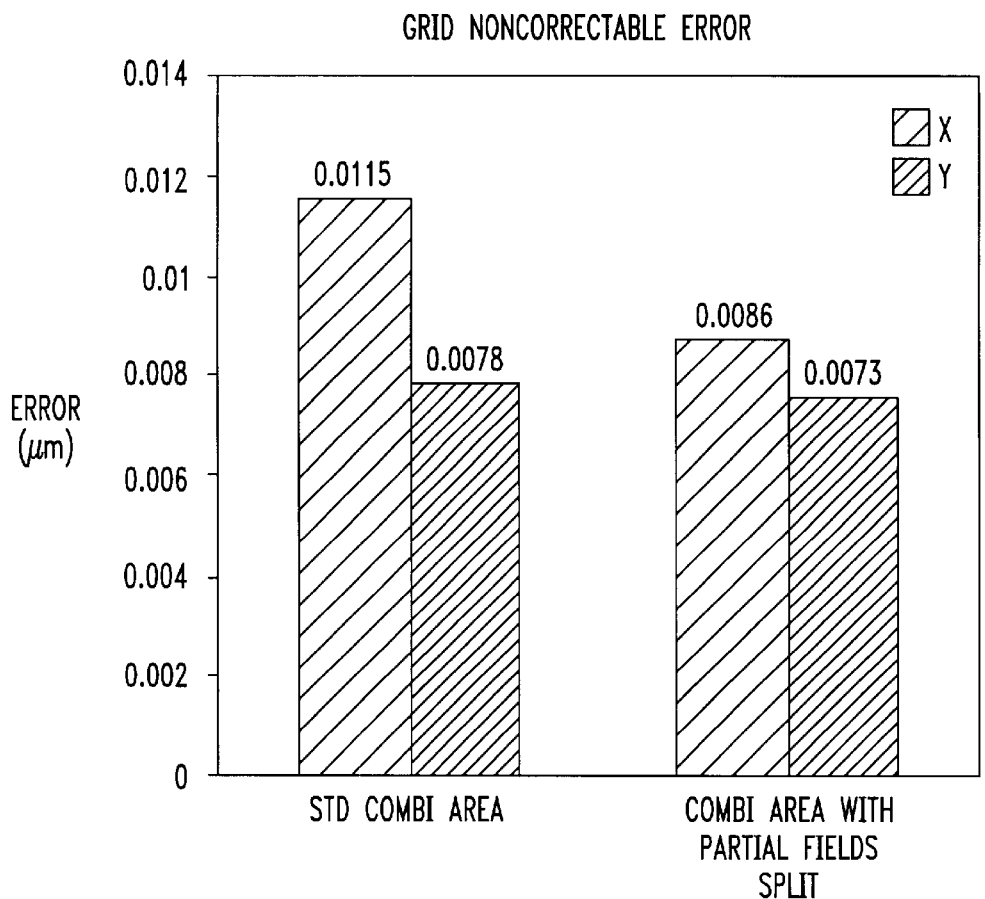
FIG. 9 is a graph showing grid non-correctable errors along the x-axis and the y- axis for conventionally fabricated wafers and for wafers constructed in accordance with an embodiment of the present invention.

As noted above, numerous patterning and associated fabrication levels are generally provided on any given wafer. Several of the wafer levels are alignment critical, meaning that accurate registration must exist between lower levels and upper levels in order to maintain adequate die yield. For modern DRAM device manufacturing, for example, some of the alignment critical levels are at the capacitor level, the field isolation level, the gate stack level, and the conductive plug formation level. With reference to FIGS. 7–9, the effects of RTP were evaluated by examining an alignment critical level and by examining the registration between two alignment critical levels. Specifically, the capacitor level and the field isolation level were examined. The effects on the registration of these two levels relative to one another were quantified by looking at combi displacement and combi residual.

The effects of RTP on overlay appear to be directly dependent on the amount of unpatterned area onto which the combis are placed. The larger this area is, the stronger the effects are and the greater the misalignment becomes across the wafer. As a consequence of this effect, heat-induced wafer deformation increases with increasingly larger unpatterned areas, and the largest periphery misalignments tend to aggregate around combi locations.

The terms "wafer" and "substrate" as used herein are to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the foregoing and following descriptions, previous process steps may have been utilized to form regions or junctions in the base semiconductor structure or foundation. In addition, the semiconductor need not be silicon-based, but could be based on silicon-germanium, germanium, or gallium arsenide.

FIG. 7 illustrates a patterned wafer 100 which includes first portions 104 and second portions 103 on a substrate 114. The first portions 104 are characterized as being mask patterns, whereas the second portions 103 are either non-patterned or are partially mask patterned as described below. Some of the second portions 103 serve as combi sites 102. The combi sites 102 are generally located on the periphery 101 of the wafer 100. Along the periphery 101, any patterning is electrically non-functional, but provides a certain mechanical property which lessens thermally-induced misalignments.

The combi sites 102 each include a combi 110. While two combi sites 102 are shown in FIG. 7, more than two combi sites may be located on the wafer 100, each being offset from x- and y-axes of a Cartesian coordinate system. If four combi sites 102 are positioned on the wafer 100, each may be separated from adjacent sites 102 by about ninety degrees. To alleviate to some extent the problem of misalignment of the combis 110 due to thermal stresses, partial mask patterning 106 is added to the combi sites 102. Generally, a stepper (not shown) is utilized to place rectangularly configured mask patterning 104 down on a photoresist layer over the wafer 100. The stepper can be programmed to put down only a portion of the amount of patterning which theoretically could be output, thereby allowing it to put down the mask patterning 106 in the combi sites 102 without mask patterning over the combis 110.

While it is important to minimize the amount of non-patterned area at the periphery 101 of the wafer 100, the combis 110 themselves are not mask patterned over. An imaginary buffer 112 surrounds each combi 110, and the stepper puts down the mask patterning 106 outside of the buffers 112 to prevent any of the patterning 106 from extending over the combis 110.

FIG. 8 illustrates a wafer 200 having combi sites 202 located along either the x- or y-axis of the Cartesian coordinate system along or near the wafer's periphery 201. Although FIGS. 7 and 8 show wafers 100, 200 with combi sites 102, 202 located either offset from a Cartesian coordinate system or along the Cartesian coordinate system, it is to be understood that the invention is not so limited. The combi sites 102,202 may be located anywhere along the periphery of the wafers 100,200.

The wafer 200 includes first portions 204 and second portions 203 on a substrate 214. The first portions 204 include fill patterning, while the second portions 203 are wholly non-patterned or partially mask patterned. Some of the second portions 203 include the combi sites 202. Each combi site 202 has a combi 210, which is surrounded by an imaginary buffer 212. A stepper (not shown) which places mask patterning in the first portions 204, can be programmed to place smaller rectangularly-shaped mask patterning 206 in the combi sites 202 to reduce the amount of non-patterned area. The mask patterning 206 is put down outside of the buffers 212 to prevent mask patterning 206 from being placed over the combis 210.

FIG. 9 illustrates the effect on grid non-correctable errors caused by placing partial mask patterning 106, 206 in combi sites 102,202. For standard combi sites, such as sites 12 or 22 on, respectively, wafers 10 or 20, the non-correctable errors found are 0.0115 $\mu$m in the direction of the x-axis and 0.0078 $\mu$m in the direction of the y-axis. In comparison, the non-correctable errors found for combi sites 102, 202 are 0.0086 $\mu$m along the x-axis and 0.0073 $\mu$m along the y-axis.

A test was conducted of various combi designs to ascertain whether certain designs would result in an increased die yield, especially around a wafer's periphery. The different combi designs tested included a standard combi and a standard combi with partial field overlay. The yield of dies from the standard combi with partial field overlay was forty dies greater than the yield from the standard combi. Specifically, the average yield of dies from the standard combi with partial field overlay was 466, with 426 dies on average yielded from the standard combi. Further, the increase in die yield occurred at the wafers' peripheries.

Figure 10:
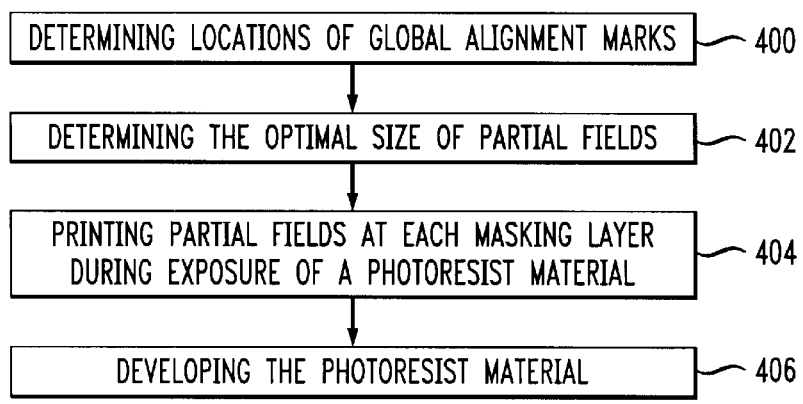
FIG. 10 is a flow diagram of the method for minimizing noncorrectable misalignments experienced near a wafer's periphery in accordance with an embodiment of the present invention.

With specific reference to FIG. 10, next will be described a method for minimizing the deleterious effects of thermally-induced wafer misalignments affecting the positioning of combis. At step 400, a determination is made of the locations of the global alignment marks. As noted above, generally the global alignment marks or combis 110, 210 are located near a wafer's periphery and may be equally spaced from adjacent combis 110, 210. Next, at step 402, the optimal size of partial field mask patterns is determined. Taken into consideration is the optimal size of a rectangularly-shaped mask pattern that does not impinge on the area bounded by the buffer zones 112, 212. At step 404, the partial field mask patterns are printed at each masking layer during exposure of a photoresist material. Finally, at step 406, the photoresist material exposed during step 404 is developed.

While the invention has been described in detail in connection with preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A semiconductor wafer comprising:

a substrate;

one or more mask patterns overlying said substrate; and one or more global alignment sites overlying said substrate, each said site including a global alignment mark and a partial mask pattern overlying a portion of said site and not overlying said alignment mark.

2. The semiconductor wafer of claim 1, further comprising a buffer zone between each said global alignment mark and said partial mask patterns partially overlying each said site.

3. The semiconductor wafer of claim 1, comprising four global alignment sites.

4. The semiconductor wafer of claim 3, wherein each said global alignment site is spaced from an adjacent said site by approximately ninety degrees.

5. The semiconductor wafer of claim 1, wherein said partial mask patterns decrease thermally-induced distortions at the global alignment sites.

6. A semiconductor wafer comprising:

a substrate;

one or more mask patterns overlying said substrate; and one or more global alignment sites overlying said substrate, each said site including a global alignment mark and a partial mask pattern overlying a portion of said site and not overlying said alignment mark, wherein said partial mask patterns reduce the amount of nonpatterned area with each said global alignment site and decrease thermally-induced distortions at the global alignment sites.

7. The semiconductor wafer of claim 6, further comprising a buffer zone between each said global alignment mark and said partial mask patterns partially overlying each said site.

8. The semiconductor wafer of claim 6, comprising four global alignment sites.

9. The semiconductor wafer of claim 8, wherein each said global alignment site is spaced from an adjacent said site by approximately ninety degrees.

* * * * *

UNITED STATES PATENT AND TRADEMARK OFFICE
CERTIFICATE OF CORRECTION

PATENT NO.     : 6,545,369 B1
DATED          : April 8, 2003
INVENTOR(S)    : Ziad R. Hatab It is certified that error appears in the above-identified patent and that said Letters Patent is hereby corrected as shown below:

<u>Title page,</u>
Item [*] Notice, should read as follows:

-- [*] Notice:   Subject to any disclaimer, the term of this patent is extended or adjusted under 35 U.S.C. 154(b) by 336 days. --.

Signed and Sealed this

Tenth Day of February, 2004

JON W. DUDAS
*Acting Director of the United States Patent and Trademark Office*